United States Patent

Brokaw

Patent Number: 5,406,222
Date of Patent: Apr. 11, 1995

[54] HIGH GAIN TRANSISTOR AMPLIFIER
[75] Inventor: A. Paul Brokaw, Burlington, Mass.
[73] Assignee: Analog Devices, Inc., Norwood, Mass.
[21] Appl. No.: 172,089
[22] Filed: Dec. 22, 1993
[51] Int. Cl.[6] .............................................. H03F 3/45
[52] U.S. Cl. ................................... 330/257; 330/259; 330/260; 330/261
[58] Field of Search ............... 330/257, 259, 260, 261, 330/275, 301

[56] References Cited

U.S. PATENT DOCUMENTS 4,857,862  8/1989  Brokaw ........................... 330/257 X
5,010,303  4/1991  Braun ............................... 330/259 X Primary Examiner—James B. Mullins
Attorney, Agent, or Firm—Iandiorio & Teska

[57] ABSTRACT

A high gain transistor amplifier with internal balancing bias having a common mode input range which includes a supply rail includes a differential to single-ended converting input stage including at least one pair of transistors, each transistor having first and second current terminals and a control terminal; input means for providing an input signal to the first current terminals of the transistors; a voltage amplifier stage for providing an amplified output of the input signal, the voltage amplifier stage including at least one transistor having a control terminal; and a biasing circuit responsive to the voltage amplifier stage for maintaining balanced currents between the control terminal of the voltage amplifier stage and the control terminals of the differential to single-ended converting input stage, the biasing circuit being connected to the second current terminals of each transistor pair and the voltage amplifier stage being connected to one of the second current terminals so that the first terminal may be driven in a common mode potential range which includes a supply rail.

9 Claims, 3 Drawing Sheets

HIGH GAIN TRANSISTOR AMPLIFIER

FIELD OF INVENTION

This invention relates to a high gain transistor amplifier with internal balancing bias having a common mode input range which includes a supply rail.

BACKGROUND OF INVENTION

One conventional high gain amplifier uses a differential stage coupled to a single ended converter such as a current mirror and a voltage gain stage as disclosed in U.S. Pat. No. 4,857,862. A feedback circuit senses the voltage gain stage current and adjusts the differential stage bias to maintain the load presented by the differential-to-single-ended-converter equal to the load presented by the voltage gain stage. Such amplifiers work well and provided substantial gain. However these amplifiers have a shortcoming: the common mode range of the differential input cannot include either extreme of the supply voltage. That is, when the common mode inputs approach one of the supply voltages the input differential stage becomes cut off and when the common mode inputs approach the other of the supply voltages the differential stage goes into voltage saturation because of the circuitry which is necessarily between it and the power supply. This is so because the bias circuit is disposed between the differential amplifier and one power supply rail and the signal output of the differential stage is disposed between the single ended converter and the other rail of the power supply.

SUMMARY OF INVENTION

It is therefore an object of this invention to provide an improved high gain transistor amplifier whose common mode input range can include an extreme of the supply voltage.

It is a further object of this invention to provide such an improved high gain transistor amplifier which has improved gain and offset.

The invention results from the realization that an improved high gain transistor amplifier which has a common mode input range that includes supply rail can be achieved by merging the differential input stage and single ended converting stage so that the bias currents can be delivered to and output can be derived from the same current terminals of the differential transistors so that the other current terminals of those transistors can be driven in a common mode potential range which includes a supply rail.

This invention features a high gain transistor amplifier with internal balancing bias having a common mode input range which includes a supply rail. There is a differential to single-ended converting input stage including at least one pair of transistors. Each transistor has first and second current terminals and a control terminal. An input stage provides an input signal to the first current terminals of the transistors. A voltage amplifier stage provides an amplified output of the input signal. The voltage amplifier stage includes at least one transistor having a control terminal. There is a biasing circuit responsive to the voltage amplifier stage for maintaining balanced currents between the control terminal of the voltage amplifier stage and the control terminal s of the differential to single-ended converting input stage. The biasing circuit is connected to the second current terminals of each transistor pair and the voltage amplifier stage is connected to one of the second current terminals so that tile first terminals may be driven in a common mode potential range which includes a supply rail.

In a preferred embodiment the input means may include a buffer amplifier connected with the first current terminals for raising the input impedance and lowering the input current to the differential to single ended converting input stage. The differential to single ended converting input stage, may include means for connecting the control terminals together and to the other of the second current terminals. The biasing circuit may include a ratioed current mirror. The high gain transistor amplifier may further include a starting circuit for establishing a minimum bias current from the biasing circuit. The means for connecting may include a bootstrap transistor with its current terminals connected between the control terminals with a pair of transistors and the other of the second current terminals. The control terminal of tile bootstrap transistor may be responsive to the voltage amplifier stage for driving the voltage on the other of the second current terminals to follow the voltage on the one of the second current terminals. The biasing circuit may include a pair of cascode transistors interconnected with the second current terminals for increasing the output impedance of the biasing circuit. The biasing circuit may include at least one transistor having a control terminal which subtracts current from the input from the voltage amplifier stage and a correction circuit responsive to the voltage amplifier stage for delivering the correcting current to the control terminals of the differential to single ended converting input stage and to the control terminal of the voltage amplifier stage to compensate for the subtracted current. The voltage amplifier stage may include a voltage offset device for increasing the voltage on the control terminal of the voltage amplifier stage to extend the common mode input range.

DISCLOSURE OF PREFERRED EMBODIMENT

Other objects, features and advantages will occur to those skilled in the art from the following description of a preferred embodiment and the accompanying drawings, in which.

Figure 1:
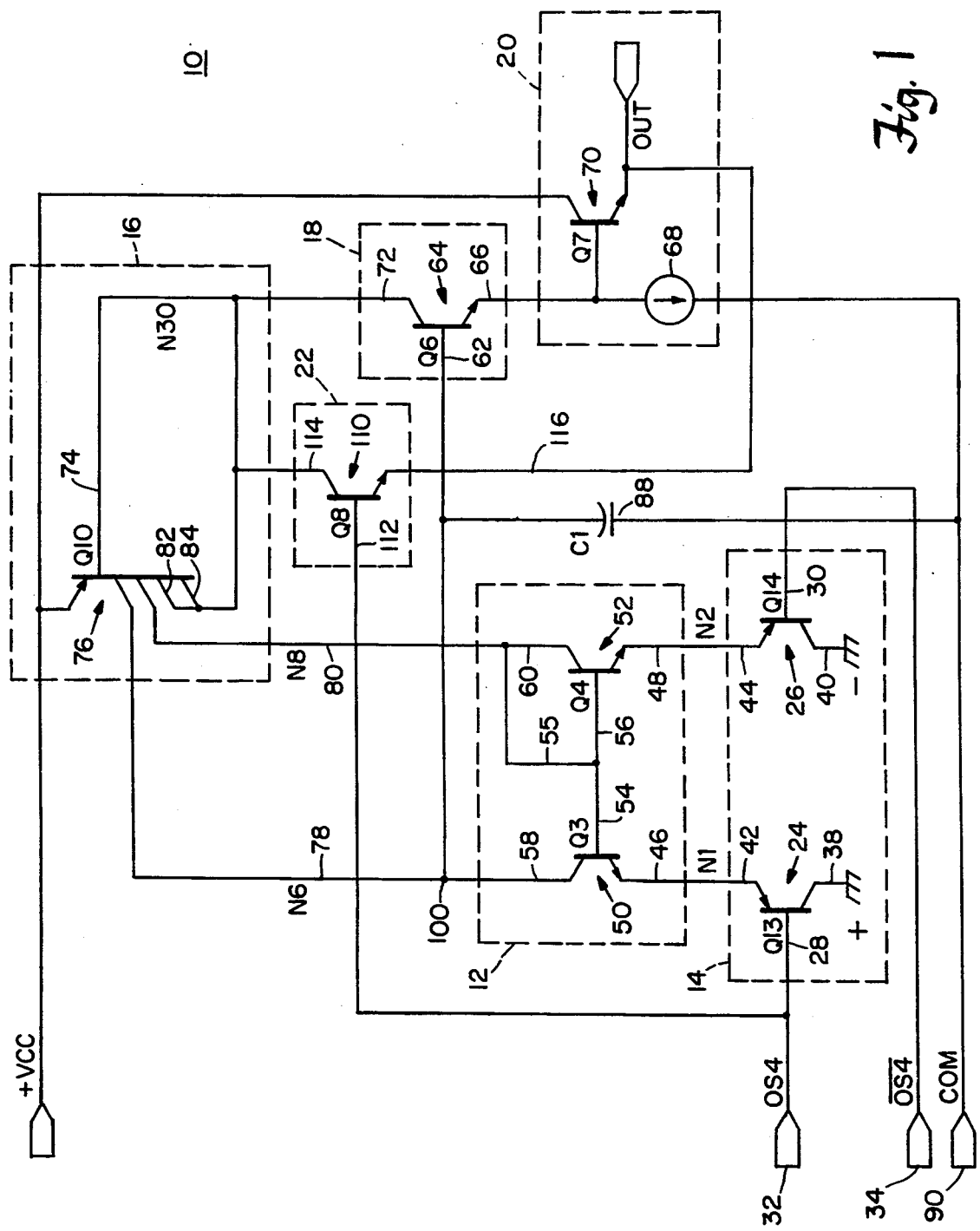
FIG. 1 is a schematic diagram of a high-gain transistor amplifier according to this invention.

There is shown in FIG. 1 a high-gain transistor amplifier 10 including a differential to single-ended converting input stage 12, input means 14 for providing an input signal to the differential to single ended converting input stage 12, and a biasing circuit 16. There is a voltage amplifier stage 18 and a load 20. Also included is a starting transistor circuit 22. Input circuit 14 includes a pair of PNP transistors 24, 26 whose control terminals 28, 30 receive the input signal at terminal 32 and the inverted input signal at 34. The collectors 38 and 40 are connected to ground while emitters 42 and 44 are connected, respectively, to the emitters 46 and 48 of transistors 50 and 52 in differential to single-ended converting input stage 12. The control terminals 54 and 56 of transistors 50 and 52 are tied together and are connected to the collector 60 of transistor 52 by conductor 55. The collector 58 of transistor 50 is connected to the control terminal 62 of transistor 64 in voltage amplifier stage 18. The emitter 66 of transistor 64 is connected to the load circuit which includes a signal source 68 that ensures that there is always some load signal and an output transistor 70. The collector 72 of transistor 64 is connected to the base 74 of the split-collector transistor 76 in biasing circuit 16. The emitter of transistor 76 is connected to positive supply voltage $V_{cc}$. Two of the collectors 78 and 80 of transistor 76 are connected to the collectors 58 and 60 of transistors 50 and 52. The other two collectors 82 and 84 are connected together and connected back to the base 74 of transistor 76. A capacitor 88 is connected from control terminal 62 of transistor 64 to common line 90 to provide frequency compensation in the feedback loop.

In operation, with equal input signals on terminals 32 and 34, transistors 24 and 26 conduct equally so that equal current flows in emitters 42 and 44 and emitters 46 and 48. Transistors 50 and 52 conduct equally, and so collector currents 58 and 60 are equal. Split-collector transistor 76 by its nature: will provide equal current on lines 78 and 80 and the sum of those currents will be made nearly equal to the collector current flowing through collector 72 of transistor 64. Since the sum of the currents in 78 and 80 are approximately equal to the current flowing through collector 72 of transistor 64, the current flowing through the collectors 58 and 60 of transistors 50 and 52 will be nearly the same, and so the combined base currents flowing through the control terminals 54 and 56 will equal the base current flowing in control terminal 62 of transistor 64. This occurs independent of the load voltage or the load current.

If a differential signal appears across terminals 32 and 34 the emitter currents in transistors 24 and 26 and 50 and 52 will tend to become unequal. When this happens the collector currents in collectors 58 and 60 of transistors 50 and 52 will tend to become unequal. But when this happens point 100 shifts either up or down depending on the direction of the differential signal on terminals 32 and 34. A change in that voltage changes the base current flowing in control terminal 62 of transistor 64. Thus for example if point 100 rises the current flowing in collector 72 of transistor 64 will also rise. This increases the base current at control terminal 74 of transistor 76 and thereby increases the current flow in collectors 78 and 80. Since the current flowing in collectors 78 and 80 has to be equal this tends to bring the system back in balance and cause the base current flowing in control terminal 62 to be equal to the sum of the base currents flowing in control terminals 54 and 56. More particularly, in the example given where point 100 becomes more positive, the base current flowing in control terminal 54 would have decreased and that in control terminal 56 would have increased relative to each other, while the base current flowing in control terminal 62 would have increased. The increase in current in the collector 72 of transistor 64 and the compensating change in the current flowing in collectors 78 and 80 increases the sum of the base currents flowing in control terminals 54 and 56 so that it matches the increased current flow of the base current in control terminal 62. This operation is similar to that of U.S. Pat. No. 4,857,862.

However, as indicated, that disclosed circuit cannot be driven so that its common mode of potential range includes a supply rail. By supply rail what is meant is a supply terminal or supply voltage.

In accordance with this invention the common mode potential range may be driven to include a supply rail because both the bias currents on collectors 78 and 80 and the output taken from point 100 are connected to the same current terminals 58 and 60 of the differential to single-ended converting input stage 12. This leaves the other terminals, specifically the emitters 46 and 48 in the specific embodiment of FIG. 1, free to include the circuit common in their common mode range. In this particular case emitters 46 and 48 are not connected directly but through the buffer transistor 24, 26 in input means 14. However, the only reason the input means 14 is used is to reduce the input current, and it could be done away with if desired.

Also shown in FIG. 1 is a starting circuit 22 including transistor 110 which has its base 112 connected to input terminal 32, its collector 114 connected to the base 74 of transistor 76, and its emitter 116 connected to load 20. If the input on terminals 32 and 34 increases but the voltage at load 20 does not and the amplifier 10 has not started, then transistor 110 will respond by turning on and injecting a small amount of current through its collector 114 into the collector-base circuit of biasing transistor 76 which will initiate the operation of amplifier 10.

Figure 2:
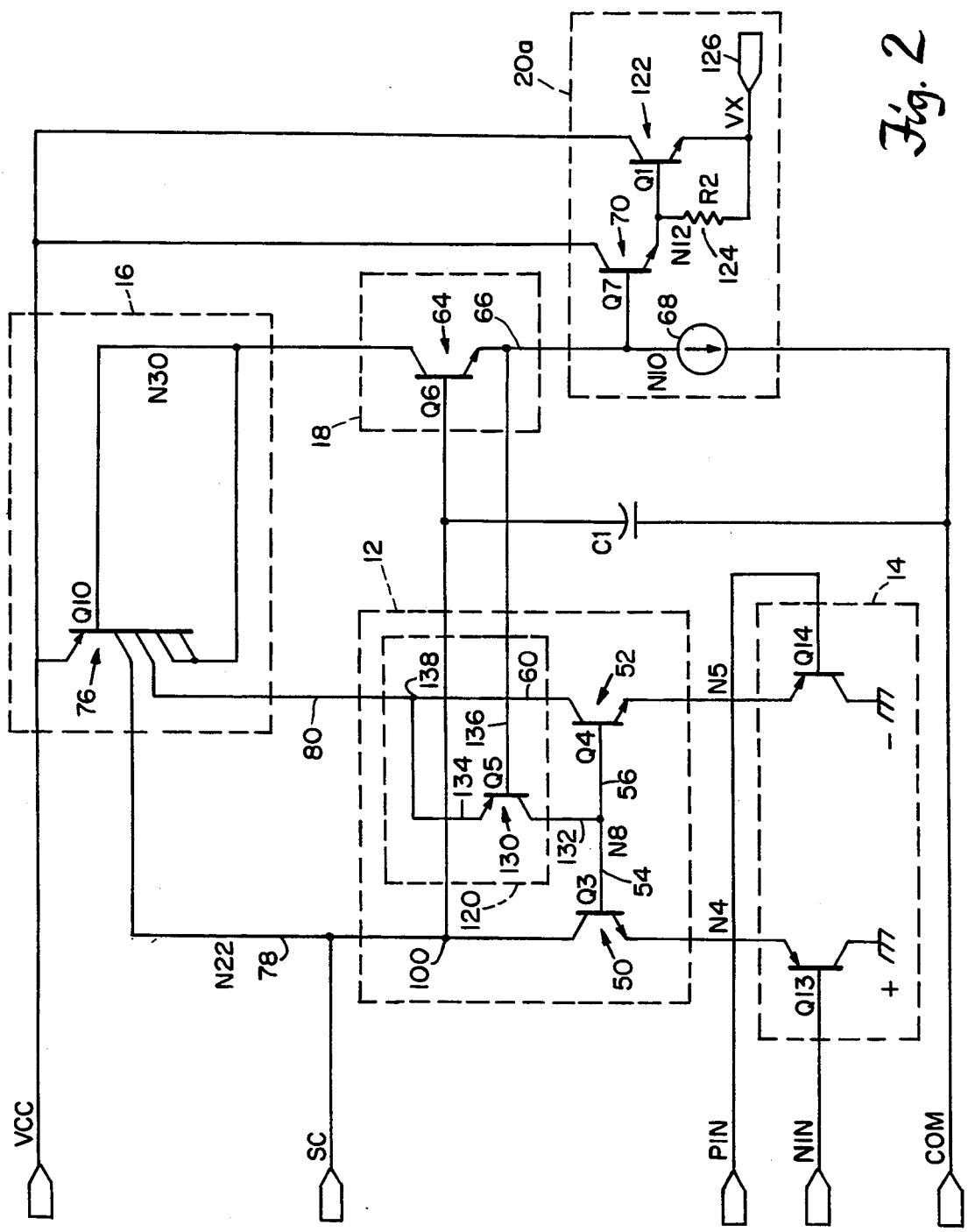
FIG. 2 is a schematic diagram similar to FIG. 1 of an alterative embodiment using a bootstrap transistor.

FIG. 2 is similar to FIG. 1 except that it has a bootstrap circuit 120 and load circuit 20 has been replaced by a slightly different load circuit 20a. Load circuit 20a includes a second transistor 122 and a resistor 124 connected between its base and the emitter. Transistor 122 simply provides greater load driving ability to output terminal 126. Bootstrap circuit 120 includes transistor 130 which takes the place of the simple conductor 55. In this case the collector 132 of transistor 130 is connected to the control terminals 56 and 54 and the emitter 134 is connected to collector 60. Control terminal or base 136 is connected to emitter 66 of transistor 64. This bootstrap circuit 120 causes the voltage at node 138 to follow that at node 100 while continuing to supply the base currents to control terminals 54 and 56. This reduces the effect of the finite output impedance of collector 60 of transistor 52 and the collector 80 on the overall gain. The circuit of FIG. 2 uses terminal SC for starting. SC is diode connected to a voltage which will raise node 100 causing current to flow in $Q_6$, should the circuit be off, but will reverse bias the diode with the voltage normally present at node 100 when the circuit is on.

Figure 3:
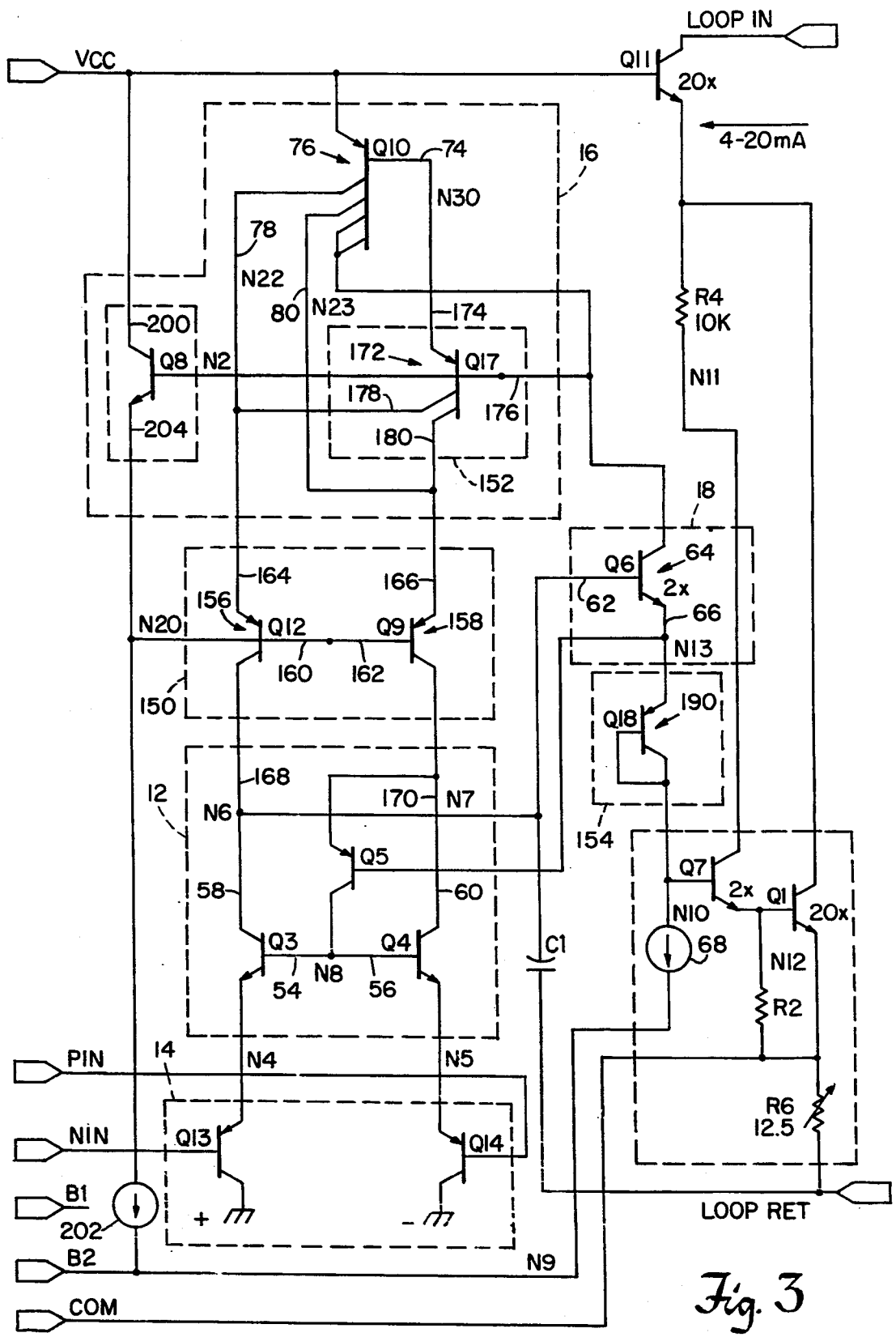
FIG. 3 is a schematic diagram similar to FIGS. 1 and 2 showing another embodiment of the invention employing a cascode bias circuit, a correction circuit, and voltage offset device in the amplifier stage.

FIG. 3 is similar to FIGS. 1 and 2 except that it includes a cascode circuit 150, a correction circuit 152, and a voltage offset circuit 154. Cascode circuit 150 includes a pair of transistors 156, 158 with their bases 160 and 162 connected together, their emitters 164 and 166 connected to collectors 78 and 80, and their collectors connected to the collectors 58 and 60 of transistors 50 and 52. Cascode circuit 150 acts to raise the output impedance of biasing circuit 16 in order to improve the gain.

Correction circuit 152 includes a split collector transistor 172 whose emitter 174 is connected to base 74 of transistor 76 and whose base 176 is connected to the collector 72 of transistor 64. The collectors 178 and 180 are connected, respectively, to the emitters 164, 166 of cascode circuit 150. Transistor 172 operates to accept the base current on base 74 which is ordinarily lost or subtracted from the currents provided on collectors 78 and 80 and reintroduces it to collectors 178 and 180 to the emitters 164 and 166 of the cascode transistors 156 and 158, thereby improving the balance between the sum of the base currents on bases 54 and 56 of transistors 50 and 52 and the base current on control terminal 62 of transistor 64 in the voltage amplifier stage 18.

Voltage offset circuit 154 includes a diode connected transistor 190 which introduces a diode junction voltage drop, typically 0.6 volts, as an offset in the emitter 66 of transistor 64, which offset appears at the control terminal 62. This offset permits an increased positive common mode input range for the amplifier 10. That permits the voltage on control terminals 54 and 56 to be increased, thereby extending the common mode range.

The circuit of FIG. 3 is started by the base current of transistor 200. Transistor 200 is biased on by current source 202 and its emitter 204 voltage is used to stabilize the voltage at the bases 160 and 162 of the cascode transistors 156 and 158. By referring the base 206 of transistor 200 to the base 176 of split-collector transistor 172 and collectors 82 and 84 of transistor 76, a non-zero minimum collector current is established in transistor 76 which insures starting.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A high gain transistor amplifier with internal balancing bias having a common mode input range which includes a supply rail comprising:
   a differential to single-ended converting input stage, including at least one pair of transistors, each transistor having first and second current terminals and a control terminal;
   input means for providing an input signal to the first current terminals of the transistors;
   a voltage amplifier stage for providing an amplified output of the input signal, said voltage amplifier stage including at least one transistor having a control terminal; and
   a biasing circuit, responsive to said voltage amplifier stage, for maintaining balanced currents between said control terminal of said voltage amplifier stage and said control terminals of said differential to single-ended converting input stage, said biasing circuit being connected to the second current terminals of each transistor and said voltage amplifier stage being connected to one of said second current terminals so that said first terminals may be driven in a common mode potential range which includes a supply rail.

2. The high gain transistor amplifier of claim 1 in which said input means includes a buffer amplifier connected with said first current terminals for raising the input impedance and lowering the input current to said differential to single-ended converting input stage.

3. The high gain transistor amplifier of claim 1 in which differential to single ended converting input stage includes means for connecting said control terminals together and to the other of said second current terminals.

4. The high gain transistor amplifier of claim 3 in which said means for connecting includes a bootstrap transistor with its current terminals connected between said control terminals of said pair of transistors and said other of said second current terminals, the control terminal of said bootstrap transistor being responsive to said voltage amplifier stage for driving the voltage on said other of said second current terminals to follow the voltage on the said one of said second current terminals.

5. The high gain transistor amplifier of claim 1 in which said biasing circuit includes a ratioed current mirror.

6. The high gain transistor amplifier of claim 1 further including a starting circuit for establishing a minimum bias current from said biasing circuit.

7. The high gain transistor amplifier of claim 1 in which said biasing circuit includes a pair of cascode transistors interconnected with said second current terminals for increasing the output impedance of said biasing circuit.

8. The high gain transistor amplifier of claim 1 in which said biasing circuit includes at least one transistor having a control terminal which subtracts current from said control terminals of said differential to single ended converting input stage and from said control terminal of said voltage amplifier stage and a correction circuit, responsive to said voltage amplifier stage, for delivering a first correcting current to said control terminals of said input stage and a second correction current to said control terminal of said voltage amplifier stage to compensate for the subtracted current.

9. The high gain transistor amplifier of claim 1 in which said voltage amplifier stage includes a voltage offset device for increasing the voltage on said control terminal of said voltage amplifier stage to extend the common mode input range.

* * * * *